United States Patent
Yamamoto et al.

(10) Patent No.: US 8,031,102 B2
(45) Date of Patent: Oct. 4, 2011

(54) A-D CONVERTER

(75) Inventors: Kazuhiro Yamamoto, Saitama (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/512,938

(22) Filed: Jul. 30, 2009

(65) Prior Publication Data

US 2010/0026544 A1 Feb. 4, 2010

Related U.S. Application Data

(63) Continuation of application No. PCT/JP2008/057014, filed on Apr. 9, 2008.

(30) Foreign Application Priority Data

Apr. 13, 2007 (JP) ................................. 2007-106410
Nov. 15, 2007 (JP) ................................. 2007-296832

(51) Int. Cl.
*H03M 1/50* (2006.01)

(52) U.S. Cl. ........................................ 341/166; 341/155

(58) Field of Classification Search .................. 341/166, 341/155, 143, 120, 156, 172
See application file for complete search history.

(56) References Cited

U.S. PATENT DOCUMENTS

| | | | |
|---|---|---|---|
| 5,416,483 A | | 5/1995 | Matsuya |
| 5,541,650 A | * | 7/1996 | Kondo ........................ 348/229.1 |
| 5,621,408 A | | 4/1997 | Cake et al. |
| 7,576,670 B2 | * | 8/2009 | Clara et al. ..................... 341/143 |
| 7,659,843 B2 | * | 2/2010 | Farley ............................ 341/155 |
| 2006/0092059 A1 | * | 5/2006 | Guimaraes .................... 341/143 |

FOREIGN PATENT DOCUMENTS

| | | |
|---|---|---|
| JP | H4-346521 A | 12/1992 |
| JP | 5-167451 A | 7/1993 |
| JP | H6-326610 A | 11/1994 |
| JP | H8-265158 A | 10/1996 |
| JP | 11-112350 A | 4/1999 |
| JP | 2000-244323 A | 9/2000 |
| JP | 2001-24512 A | 1/2001 |
| JP | 2004-208167 A | 7/2004 |

OTHER PUBLICATIONS

International Search Report (ISR) for PCT/JP2008/057014 for Examiner consideration, citing U.S. Patent No. 1 and Foreign Patent Document Nos. 1-3 listed above.
Written Opinion (PCT/ISA/237) of PCT/JP2008/057014.
Taiwanese Office Action in a counterpart application No. 097113219, dated Jun. 22, 2011.
Japanese Office Action dated Jul. 19, 2011, in a counterpart Japanese patent application No. 2009-510826, citing Foreign Patent document Nos. 1-4.

* cited by examiner

*Primary Examiner* — Joseph Lauture
(74) *Attorney, Agent, or Firm* — Chen Yoshimura LLP

(57) ABSTRACT

Provided is an AD converter that converts an input analog signal into a digital signal, comprising an integrator that sequentially integrates signal levels of the analog signal to obtain an integrated waveform, and outputs the integrated waveform; a digital converting section that detects, with prescribed units of temporal resolution, a transition timing, which is a timing at which a magnitude relationship between a signal level of the integrated waveform and a prescribed reference value transitions to a predetermined state; a feedback section that controls the signal level of the integrated waveform with a control period longer than a unit of temporal resolution, according to a result of the detection by the digital converting section; and a signal processing section that generates the digital signal based on the detection result by the digital converting section.

15 Claims, 10 Drawing Sheets

A-D CONVERTER

CROSS REFERENCE TO RELATED APPLICATION

This is a continuation application of PCT/JP2008/57014 filed on Apr. 9, 2008 which claims priority from Japanese Patent Applications No. 2007-106410 filed on Apr. 13, 2007, and No. 2007-296832 filed on Nov. 15, 2007, the contents of which are incorporated herein by reference.

BACKGROUND

1. Technical Field

The present invention relates to an AD converter that converts an analog signal into a digital signal. In particular, the present invention relates to an AD converter that uses delta-sigma modulation.

2. Related Art

A circuit using delta-sigma modulation is known as an AD converter for converting an analog signal into a digital signal, as shown in, for example, Japanese Patent Application Publication No. 2001-24512. Delta-sigma modulation involves converting an analog signal into a digital signal by performing a feedback process to subtract a prescribed reference value from an added value when the value sequentially added to the level of the analog signal becomes greater than the reference value.

FIG. 10 shows a conventional AD converter 200. The AD converter 200 is provided with a level calculating section 210, an integrator 220, a 1-bit ADC 230, a signal processing section 240, a delay device 250, and a 1-bit DAC 260.

The integrator 220 integrates the level of the analog signal. The 1-bit ADC 230 outputs a binary signal indicating whether the output from the integrator 220 is greater than a reference value. The delay device 250 delays the signal output from the 1-bit ADC 230 by one cycle. Here, "one cycle" refers to one cycle of a sampling clock supplied to the 1-bit ADC 230. When supplied with a logic value of 1 from the delay device 250, the 1-bit DAC 260 outputs, to the level calculating section 210, a level corresponding to the reference value in the 1-bit ADC 230. The level calculating section 210 subtracts the level output by the 1-bit DAC 260 from the level of the input analog signal, and supplies the result to the integrator 220.

The signal processing section 240 generates a digital signal based on the signal output by the 1-bit ADC 230. For example, the signal processing section 240 may generate the digital signal according to the distribution of the timings at which the 1-bit ADC 230 outputs a logic value of 1.

As described above, the AD converter 200 generates the value of the digital signal based on the timing at which the 1-bit ADC 230 outputs a logic value of 1. Therefore, the AD converter 200 can generate the value of the digital signal with a higher resolution when the 1-bit ADC 230 has a higher sampling frequency and a higher resolution with respect to time.

However, there is a limit to how much the sampling frequency of the 1-bit ADC 230 can be enhanced simply by increasing the frequency of the sampling clock. Furthermore, it is difficult for the comparison result by the 1-bit ADC 230 to be fed back to the level calculating section 210 within a single cycle of a high-speed sampling clock.

SUMMARY

Therefore, it is an object of an aspect of the innovations herein to provide an AD converter, which is capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary AD converter may include an AD converter that converts an input analog signal into a digital signal, comprising: an integrator that sequentially integrates signal levels of the analog signal to obtain an integrated waveform, and outputs the integrated waveform; a digital converting section that detects, with prescribed units of temporal resolution, a transition timing, which is a timing at which a magnitude relationship between a signal level of the integrated waveform and a prescribed reference value transitions to a predetermined state; a feedback section that controls the signal level of the integrated waveform with a control period longer than a unit of temporal resolution, according to a result of the detection by the digital converting section; and a signal processing section that generates the digital signal based on the detection result by the digital converting section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
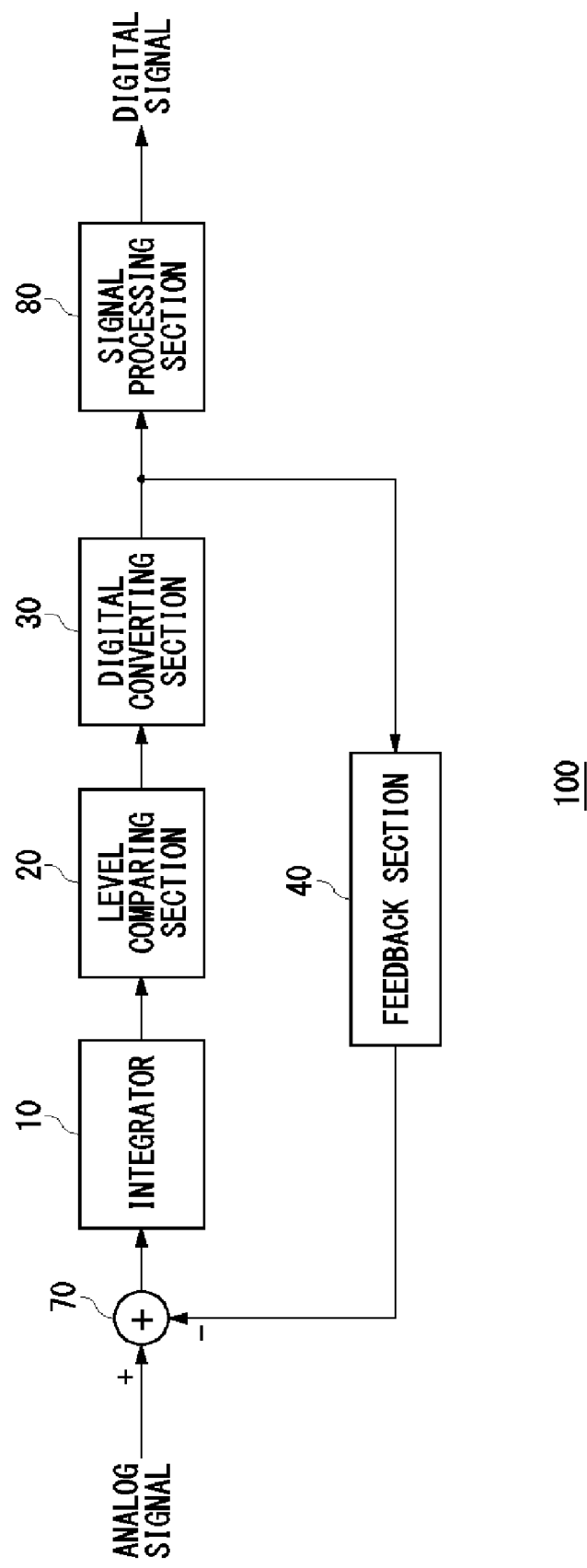
FIG. 1 shows an exemplary configuration of an AD converter 100 according to an embodiment of the present invention.

FIG. 1 shows an exemplary configuration of an AD converter 100 according to an embodiment of the present invention. The AD converter 100 is a circuit that converts an input analog signal into a digital signal, and is provided with an integrator 10, a level comparing section 20, a digital converting section 30, a feedback section 40, a level calculating section 70, and a signal processing section 80.

The integrator 10 outputs an integrated waveform obtained by sequentially integrating the signal level of the analog signal. The integrator 10 may be an analog integration circuit that uses an operational amplifier, a capacitor, and the like. More specifically, the integrator 10 does not discretely add the signal level of the analog signal at prescribed intervals, but rather outputs a continuous integrated waveform by charging and discharging the capacitor according to the analog signal.

The level comparing section 20 outputs a logic value corresponding to a comparison result of whether the signal level of the integrated waveform output by the integrator 10 is greater than a prescribed reference value. This reference value may be set in advance by a user, for example. The level comparing section 20 may include an operational amplifier having two input terminals that are supplied with the integrated waveform and the reference value, respectively. The level comparing section 20 outputs, as a continuous waveform, the logic value indicating the magnitude relationship between the reference value and the signal level of the integrated waveform. For example, the level comparing section 20 may output a logic value of 1 when the signal level of the integrated waveform is greater than the reference value.

The digital converting section 30 detects a transition timing, which is the timing at which a magnitude relationship between the reference value and the signal level of the integrated waveform transitions to a prescribed state, with prescribed units of temporal resolution. For example, the digital converting section 30 may detect, with the prescribed units of temporal resolution, the timing of an excessive state in which the signal level of the integrated waveform transitions to exceed the prescribed reference value. The digital converting section 30 may instead detect, with the prescribed units of temporal resolution, the timing of an excessive state in which the signal level of the integrated waveform transitions to fall beneath the prescribed reference value. The "units of temporal resolution" refers to measurement units of resolution of the digital converting section 30 with regard to time.

The digital converting section 30 may acquire a constant reference value as the prescribed reference value, or may acquire the signal level of a waveform obtained by integrating a second analog signal as the prescribed reference value. In the latter case, the transition timing detected by the digital converting section 30 corresponds to the timing of the crosspoint between the first analog signal and the second analog signal supplied to the integrator 10. The first and second analog signals may be differential signals.

The following describes an example in which the digital converting section 30 detects, as the aforementioned transition timing, the timing of the excessive state at which the signal level of the integrated waveform of the analog signal exceeds a fixed reference value. The digital converting section 30 may sequentially detect, at each sampling timing, whether the signal level of the integrated waveform is greater than the reference value. In this case, the period of the sampling timing corresponds to the units of temporal resolution described above.

The digital converting section 30 may detect the ordinal number of the sampling timing at which the signal level of the integrated waveform is greater than the reference value. For example, the digital converting section 30 may detect the logic value output by the level comparing section 20 at each sampling timing. When the digital converting section 30 detects that the level comparing section 20 outputs a value of 1, the digital converting section 30 determines that the signal level of the integrated waveform is greater than the reference value.

The sampling timing may have a period that is 1/n times the operational period of the AD converter 100, where n is an integer greater than 1. The digital converting section 30 may detect which ordinal number of the sampling timing in the present cycle of the operational period is a sampling timing at which the signal level of the integrated waveform is detected to be greater than the reference value.

The digital converting section 30 may use a method other than the sampling described above to detect the timing at which the signal level of the integrated waveform is greater than the reference value. For example, the digital converting section 30 may detect this timing by counting the number of pulses of a prescribed measurement clock that pass until the signal level of the integrated waveform becomes greater than the reference value.

The digital converting section 30 may generate the sampling timing according to a supplied reference clock. The reference clock may have the same period as the operational period of the AD converter. More specifically, the digital converting section 30 may generate a plurality of strobes having different phases in each cycle of the reference clock, and detect the logic value output by the level comparing section 20 according to these strobes.

The digital converting section 30 may detect, in each cycle of the reference clock, the timing at which the logic value output by the level comparing section 20 transitions. The configuration and operation of the digital converting section 30 is described below in relation to FIGS. 2 and 3.

The feedback section 40 controls the signal level of the integrated waveform according to the detection result of the digital converting section 30, with a control period that is greater than a unit of temporal resolution of the digital converting section 30. The control period of the feedback section 40 may be the same as the operational period of the AD converter 100. In other words, the feedback section 40 controls the signal level of the integrated waveform with a control period that is equal to n units of temporal resolution of the digital converting section 30, where n is an integer greater than 1.

The feedback section 40 may control the signal level of the integrated waveform by supplying a feedback signal to the level calculating section 70 according to the detection result of the digital converting section 30. The level calculating section 70 is provided on the input side of the integrator 10, and adds or subtracts (i) a signal level corresponding to the feedback signal to or from (ii) the signal level of the analog signal input to the integrator 10. The level calculating section 70 inputs the result of this addition or subtraction into the integrator 10.

For example, when the digital converting section 30 detects the timing of the excessive state at which the signal level of the integrated waveform is greater than the prescribed reference value, the level calculating section 70 may subtract a prescribed signal level from the signal level of the integrated waveform. On the other hand, when the digital converting section 30 detects the timing of the excessive state at which the signal level of the integrated waveform is less than a prescribed reference value, the level calculating section 70 may add a prescribed signal level to the signal level of the integrated waveform. The following describes an example in which the level calculating section 70 subtracts a prescribed signal level from the signal level of the integrated waveform.

The feedback section 40 may subtract a predetermined signal level from the signal level of the integrated waveform at a timing corresponding to the timing of the excessive state at which the digital converting section 30 detects the signal level to be different from the reference value, within the operational period. The feedback section 40 may instead subtract (i) the signal level corresponding to the timing at which the digital converting section 30 detects the signal level to be in the excessive state from (ii) the signal level of an operational waveform, at a predetermined timing in the operational period. As another example, the feedback section 40 may adjust both the timing and the signal level of the feedback signal according to the timing detected by the digital converting section 30.

The signal processing section 80 generates the digital signal based on the detection result of the digital converting section 30. For example, the signal processing section 80 may generate the digital signal according to a distribution of the timings at which the digital converting section 30 detects the excessive state. More specifically, the signal processing section 80 may input the sampling result output by the digital converting section 30 into a low-pass digital filter. In this case, the digital converting section 30 may output a pulse at the timing at which the excessive state is detected.

The signal processing section 80 may include a decimation filter that extracts data at prescribed data intervals from a data sequence output by the low-pass digital filter. The signal processing section 80 may have the same configuration as the signal processing section in the conventional AD converter using delta-sigma modulation.

With this configuration, the AD converter 100 can detect the timing of the excessive state with units of temporal resolution finer than the operational frequency of the AD converter 100, i.e. the control period of the feedback section 40. Therefore, the AD converter 100 can accurately generate the digital signal. Furthermore, the frequency of the reference clock supplied to the AD converter 100 may be less than the sampling frequency of the digital converting section 30, and so it is easy to generate the reference clock supplied to the AD converter 100.

Figure 2:
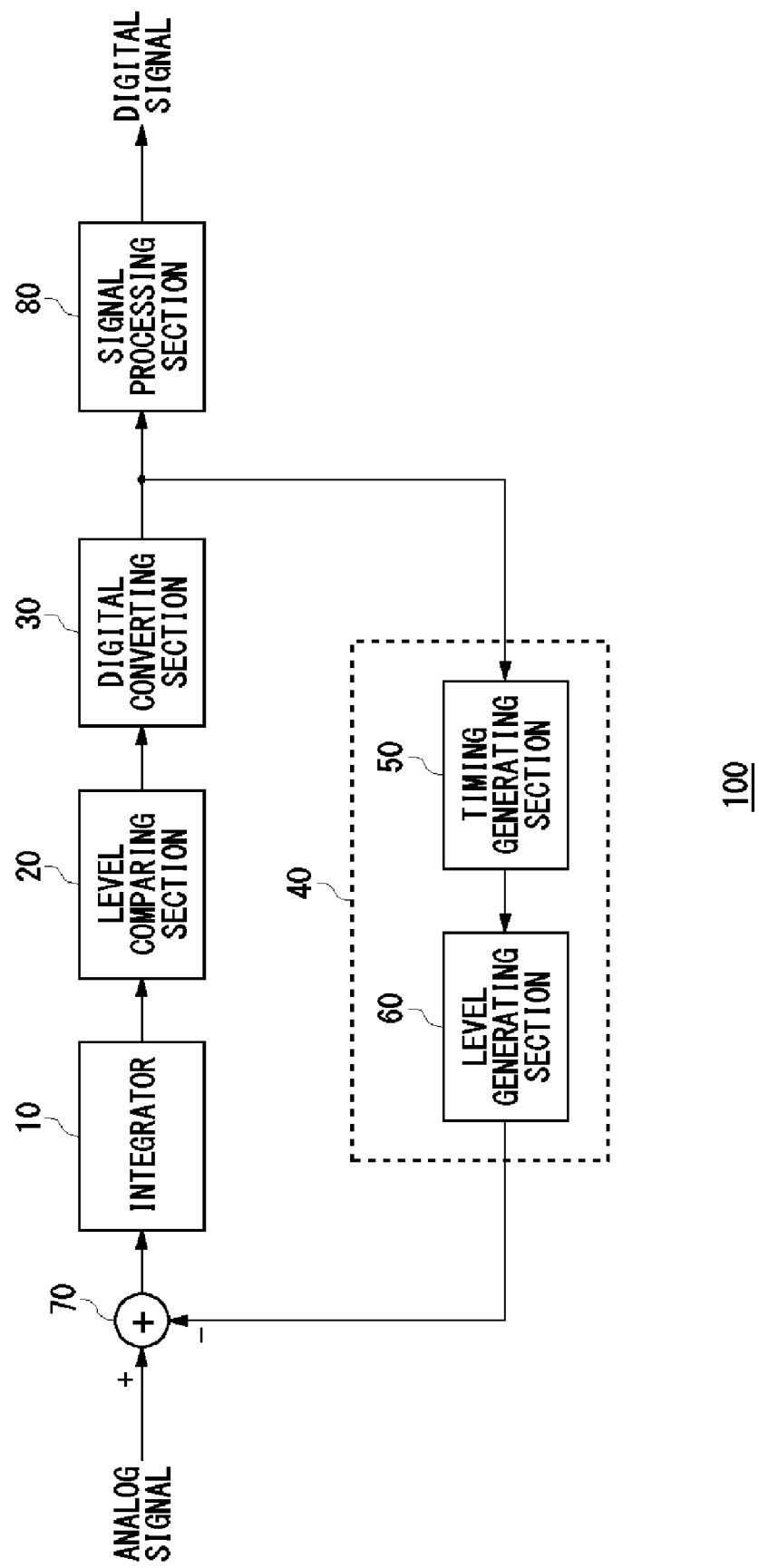
FIG. 2 shows an exemplary configuration of the feedback section 40.

FIG. 2 shows an exemplary configuration of the feedback section 40. The feedback section 40 of the present embodiment subtracts a predetermined signal level from the signal level of the integrated waveform at a timing corresponding to the timing at which the digital converting section 30 detects the excessive state within the operational period, as described above.

The feedback section 40 of the present embodiment may subtract a predetermined signal level from the signal level of the integrated waveform after a prescribed time has passed from the timing at which the digital converting section 30 detects the excessive state. For example, the feedback section 40 may perform the feedback after a plurality of sampling timings have passed since the digital converting section 30 detects the excessive state.

When the digital converting section 30 detects the excessive state in a certain cycle of the reference clock, the feedback section 40 of the present embodiment subtracts the predetermined signal level from the signal level of the integrated waveform in a cycle of the reference clock after this certain cycle. For example, when the digital converting section 30 detects the excessive state in a certain cycle of the reference clock, the feedback section 40 may subtract the predetermined signal level from the signal level of the integrated waveform in the next cycle of the reference clock after this certain cycle. At this time, the relative timing in the cycle for subtracting the signal level may be set according to the relative timing of the excessive state detection in the previous cycle. For example, the feedback section 40 may generate the feedback timing by delaying the reference clock pulse in the cycle following the cycle in which the excessive state was detected, according to the relative timing in the cycle at which the excessive state was detected.

The feedback section 40 of the present embodiment includes a timing generating section 50 and a level generating section 60. The timing generating section 50 generates a feedback signal obtained by delaying the reference clock pulse in the cycles following the cycle in which the excessive state was detected by an amount according to the relative timing in the cycle at which the excessive state was detected.

The level generating section 60 generates the signal level to be subtracted by the level calculating section 70, according to the feedback signal. For example, the level generating section 60 may generate the signal level according to a reference value of the level comparing section 20. The level generating section 60 may instead generate the signal level according to the duration over which the excessive state continues. The level calculating section 70 subtracts the signal level output by the level generating section 60 from the signal level of the analog signal input to the integrator 10, and inputs the result to the integrator 10.

Figure 3:
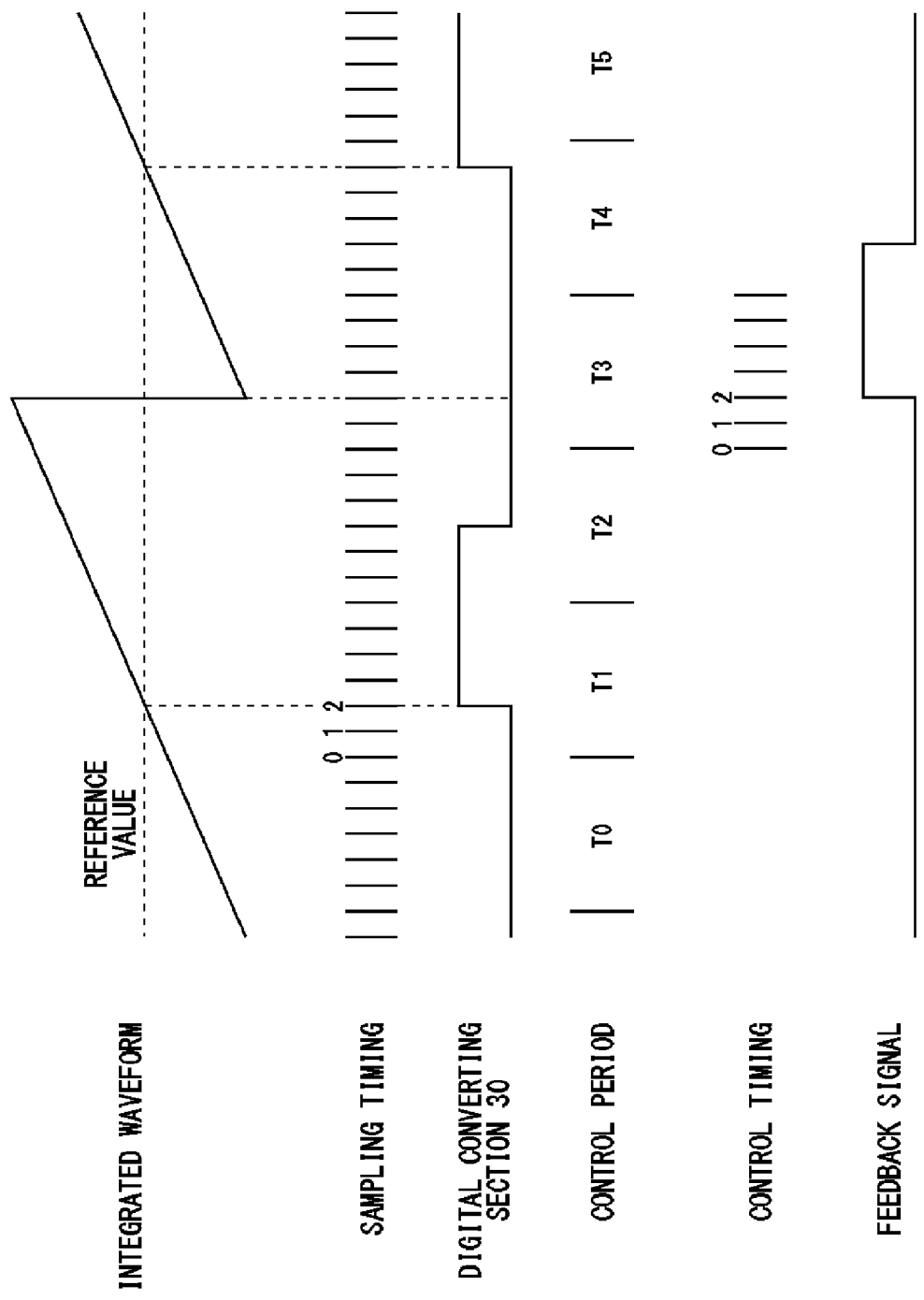
FIG. 3 is a timing chart showing an exemplary operation of the AD converter 100 described in relation to FIG. 2.

FIG. 3 is a timing chart showing an exemplary operation of the AD converter 100 described in relation to FIG. 2. The present embodiment describes an example in which the signal level of the signal under measurement is substantially constant and the slope of the integrated waveform is also substantially constant.

The digital converting section 30 sequentially detects whether the signal level of the integrated waveform is in the excessive state, at each sampling timing. The digital converting section 30 may detect the order of the sampling timings at which the excessive state is detected in each cycle of the operational period of the AD converter 100, i.e. the control period of the feedback section 40. In the present embodiment, the digital converting section 30 detects the timing of the excessive state to be the second sampling timing in the cycle T1 of the operational period.

The timing generating section 50 generates the feedback signal with a phase corresponding to the timing at which the digital converting section 30 detects the excessive state. For example, the timing generating section 50 generates the feedback signal in the cycle T3, which is after the cycle T1 of the control period in which the digital converting section 30 detected the excessive state, at the second control timing, which is the control timing corresponding to the second sampling timing in the cycle T1 at which the digital converting section 30 detected the excessive state. Here, a unit of temporal resolution, i.e. period, of the sampling timing is substantially the same as a unit of temporal resolution, i.e. period, of the control timing.

The level generating section adjusts the signal level of the feedback signal generated by the timing generating section 50 to be the predetermined signal level, and supplies the resulting signal to the level calculating section 70. The level calculating section 70 subtracts the signal level of the feedback signal from the signal level of the integrated waveform. In FIG. 3, the signal level of the integrated waveform is instantaneously decreased at a rising edge of the feedback signal, but the level calculating section 70 may instead decrease the signal level of the integrated waveform over a prescribed duration. For example, the level calculating section 70 may decrease the signal level of the integrated waveform over a duration corresponding to the pulse width of the feedback signal.

With this operation, the AD converter 100 can detect a timing at which the integrated waveform becomes greater than the reference value with units of temporal resolution finer than the operational period of the AD converter 100. Furthermore, since the feedback signal includes information concerning this timing, the AD converter 100 can perform AD conversion with a high precision.

Figure 4:
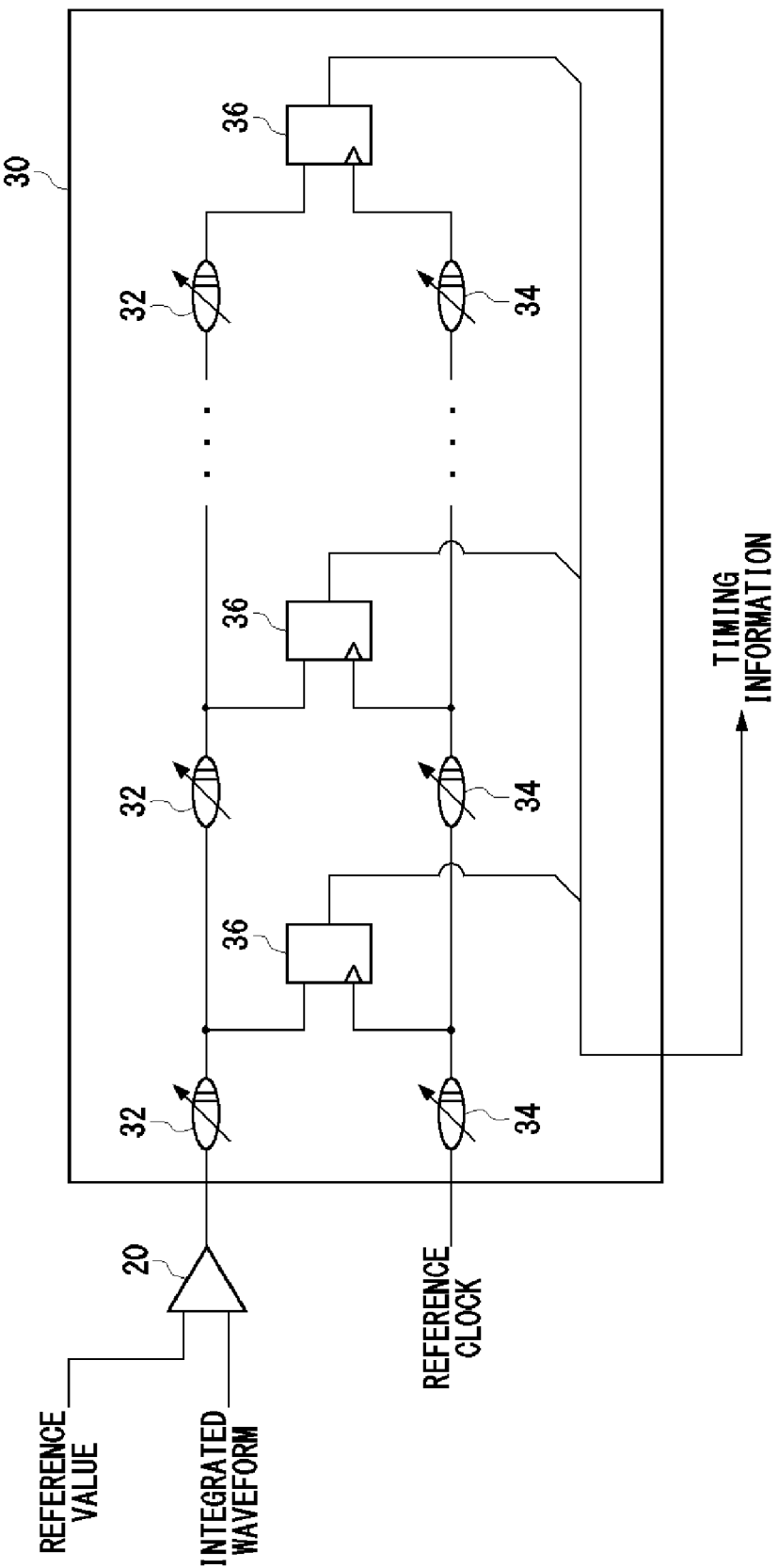
FIG. 4 shows an exemplary configuration of the digital converting section 30.

FIG. 4 shows an exemplary configuration of the digital converting section 30. The digital converting section 30 includes a plurality of second delay elements 34 and a plurality of detection circuits 36. The plurality of second delay elements 34 are provided in a cascade connection, and generate a plurality of strobe signals by sequentially delaying a reference clock supplied thereto.

More specifically, for each pulse, i.e. cycle, of the reference clock, the plurality of second delay elements 34 generate a plurality of strobe signals having different phases. The strobe signals generated in each cycle may be arranged uniformly within the cycle. In this case, each second delay element 34 may have the same delay amount.

The plurality of detection circuits 36 are provided to correspond one-to-one with the plurality of second delay elements 34. Each detection circuit 36 detects the logic value output by the level comparing section 20 at a timing of the strobe signal output by the corresponding second delay element 34. In this way, in each cycle of the reference clock, the plurality of detection circuits 36 can detect whether the signal level of the integrated waveform is greater than the reference value at sampling timings corresponding to the strobe signals output by the second delay elements 34. In other words, the AD converter 100 can detect the excessive state with units of temporal resolution corresponding to the delay values of the second delay elements 34, which is less than the period of the reference clock.

As shown in FIG. 4, the digital converting section 30 may further include a plurality of first delay elements 32. The plurality of first delay elements 32 are provided to correspond one-to-one with the plurality of second delay elements 34. The first delay elements 32 corresponding respectively to the detection circuits 36 may have the same delay amount. The delay amounts of the first delay elements 32 and the second delay elements 34 are different.

Each detection circuit 36 detects the logic value of the delay signal output by the corresponding first delay element 32, at a timing of the strobe signal output by the corresponding second delay element 34. In the present embodiment, the phase difference between the strobe signal and the delay signal input to the detection circuit 36 at each stage differs according to the difference in the delay amount between the corresponding first delay element 32 and second delay element 34. In other words, the AD converter 100 can sample the signal waveform output by the level comparing section 20 with units of temporal resolution corresponding to the difference in delay amount between the first delay elements 32 and the second delay elements 34.

The difference in delay amount between the first delay elements 32 and the second delay elements 34 can be less than the smallest delay amount that the second delay elements 34 can generate. Therefore, this configuration allows finer units of temporal resolution than having the units of temporal resolution corresponding to the delay amount of the second delay elements 34, as described above.

The digital converting section 30 outputs, for each cycle of the reference clock, timing information according to the detection results by the plurality of detection circuits 36. The timing information may include bit values of the logic values detected by each of the detection circuits 36, for example. In other words, if N detection circuits 36 are provided, the timing information may include N bits. With the timing information, the duration of the excessive state can be detected with an N-bit resolution by detecting the bit positions indicating a logic value of 1.

Figure 5:
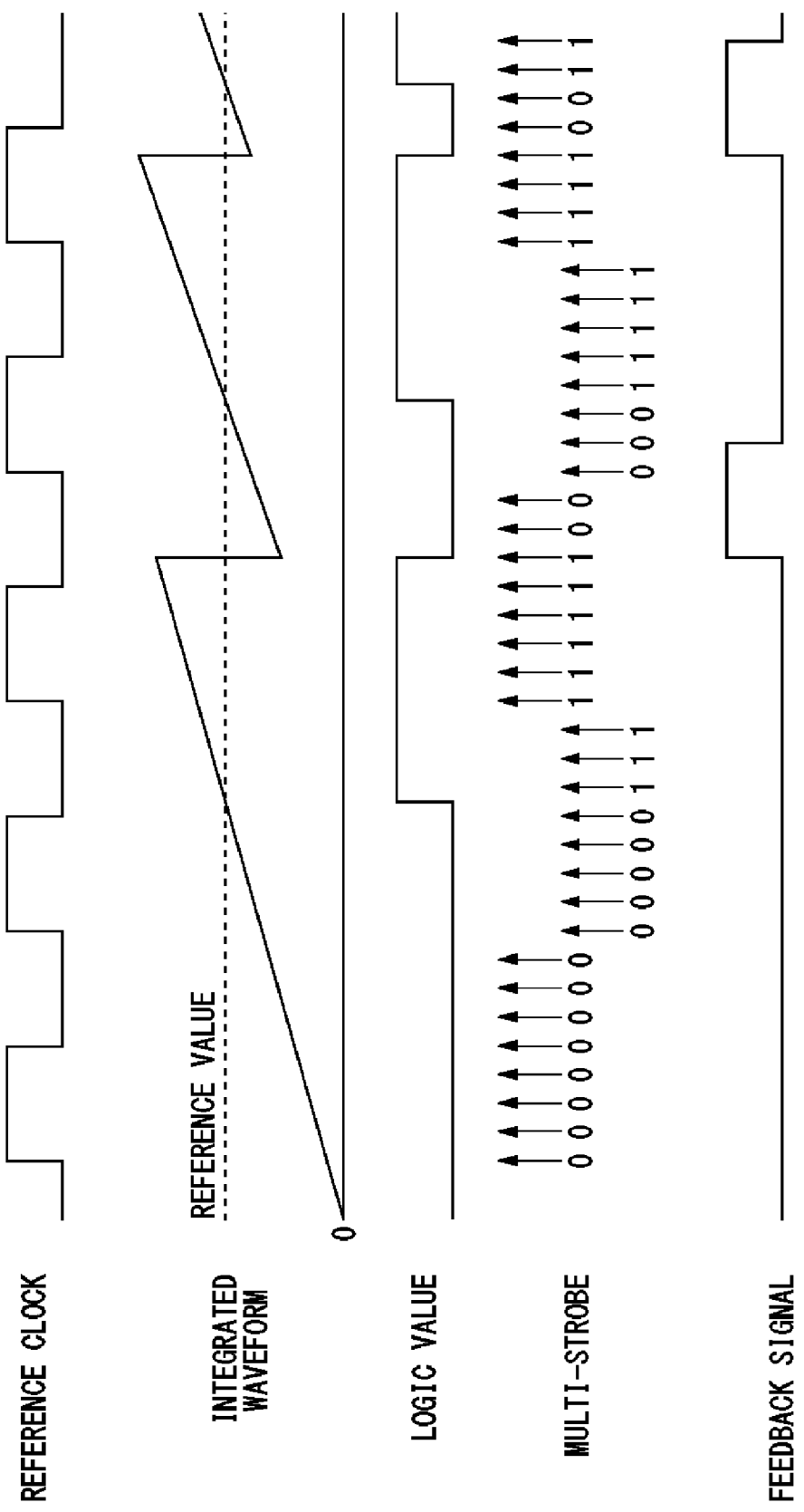
FIG. 5 is a timing chart showing an exemplary operation of the AD converter 100.

FIG. 5 is a timing chart showing an exemplary operation of the AD converter 100. The present embodiment describes an example in which the signal level of the signal under measurement is substantially constant and the slope of the integrated waveform is also substantially constant. If the interval between the strobe signals is sufficiently smaller than the period of the signal under measurement, the change in the signal level of the signal under measurement in one period of the strobe signal is sufficiently small. Therefore, the signal level of the signal under measurement in a prescribed section can be treated as substantially constant.

The level comparing section 20 outputs a logic value indicating whether the integrated waveform is greater than the reference value. For each cycle of the reference clock, the digital converting section 30 generates a multi-strobe including a plurality of strobe signals. In FIG. 5, the multi-strobes are shown on alternating lines, so that each multi-strobe can be distinguished.

The digital converting section 30 may output logic values detected according to each strobe signal as the timing information in each cycle of the reference clock. For example, the timing information in the first cycle in FIG. 5 is "00000000" and the timing information in the second cycle is "00000111."

The timing generating section 50 receives timing information from the digital converting section 30 for each cycle of the reference clock. When the received timing information indicates a logic value transition from 0 to 1, the timing generating section 50 outputs a feedback signal obtained by delaying, according to the timing information, the pulse of the reference clock in the cycle following the cycle including the transition.

In the example of FIG. 5, the logic value transitions from 0 to 1 in the timing information of the second cycle. At this point, the timing generating section 50 outputs a feedback signal obtained by delaying, according to the timing information, the pulse of the reference clock in the third cycle. The timing generating section 50 may delay the reference clock such that the phase of the strobe signal at which the transition was detected in the cycle is the same as the phase of the feedback signal in the cycle. For example, as shown in FIG. 5, when the logic value transition is detected at the sixth strobe signal in the second cycle, the timing generating section 50 delays the pulse in the third cycle of the reference clock until a timing of the sixth strobe signal in the third cycle.

The level generating section 60 and the level calculating section 70 subtract the prescribed signal level from the signal level of the integrated waveform, according to the feedback signal. The subtracted amount may be determined according to the level of the reference value of the level comparing section 20. In the AD converter 100 of the present embodiment, the feedback timing is later than the timing of the transition to the excessive state, and therefore even if the reference value is subtracted from the signal level of the integrated waveform at the feedback timing, the signal level after the subtraction might still be greater than the reference value. Therefore, the level generating section 60 and the level calculating section 70 may subtract a value larger than the reference value from the signal level of the integrated waveform. This subtracted value may be determined according to the duration over which the excessive state continues, e.g. the delay amount of the feedback timing.

The value A×T, which is obtained from multiplying the signal level A of the analog signal by a prescribed duration T, is practically equal to the value W×N, which is a product of the subtracted value W and the number of times N this value is subtracted over the duration T. The signal processing section 80 can convert the signal level of the analog signal over the duration T into a digital value, based on the expression W×N/T.

By generating the plurality of strobe signals for each pulse of the reference clock in this way, the AD converter 100 can detect the excessive state with a high temporal resolution. Therefore, the AD converter 100 can accurately generate a digital signal. Furthermore, since a single feedback process is performed for a plurality of strobe signals, the operational speed of the feedback process can be slowed to allow for easier circuit design and the like.

Figure 6:
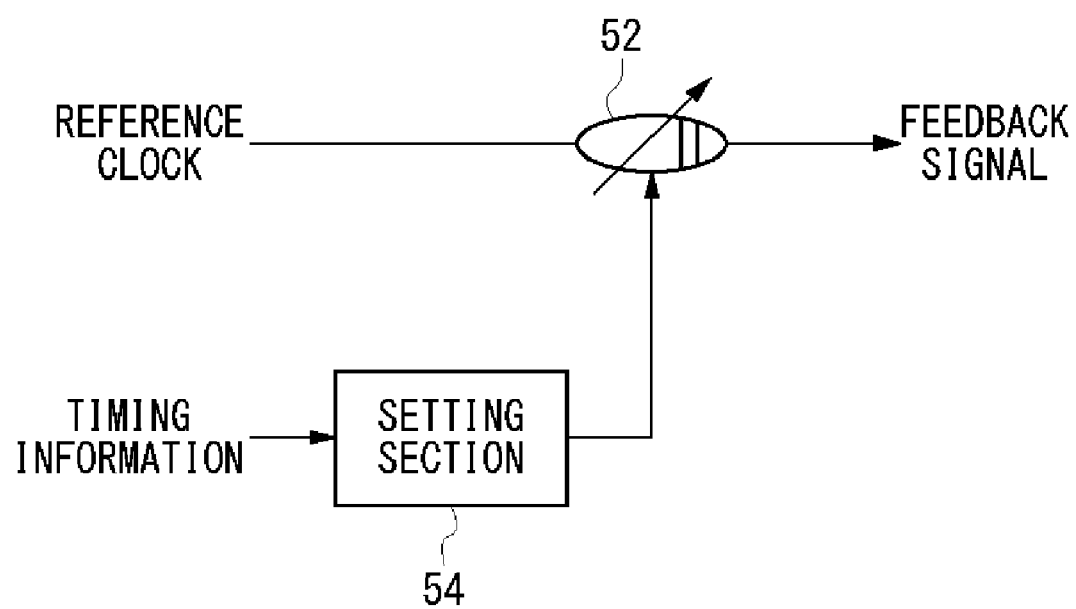
FIG. 6 shows an exemplary configuration of the timing generating section 50.

FIG. 6 shows an exemplary configuration of the timing generating section 50. The timing generating section 50 includes a variable delay circuit 52 and a setting section 54. The variable delay circuit 52 delays the reference clock and outputs the result. The setting section 54 sets the delay time of the variable delay circuit 52 based on the timing information. For example, the setting section 54 may receive timing information at each cycle of the reference clock and set the variable delay circuit 52 to have a delay amount for following cycles of the reference clock based on this timing information. If a logic value transition is not detected in the timing information, the setting section 54 may control the variable delay circuit 52 to not output a pulse of the reference clock.

The setting section 54 may add a prescribed offset to the delay amount set for the variable delay circuit 52, such that the integrated waveform is not oscillated due to the feedback signal. For example, the setting section 54 may add a prescribed offset value such that the period with which the feedback signal is input to the level calculating section 70 differs from the period of the analog signal.

Figure 7:
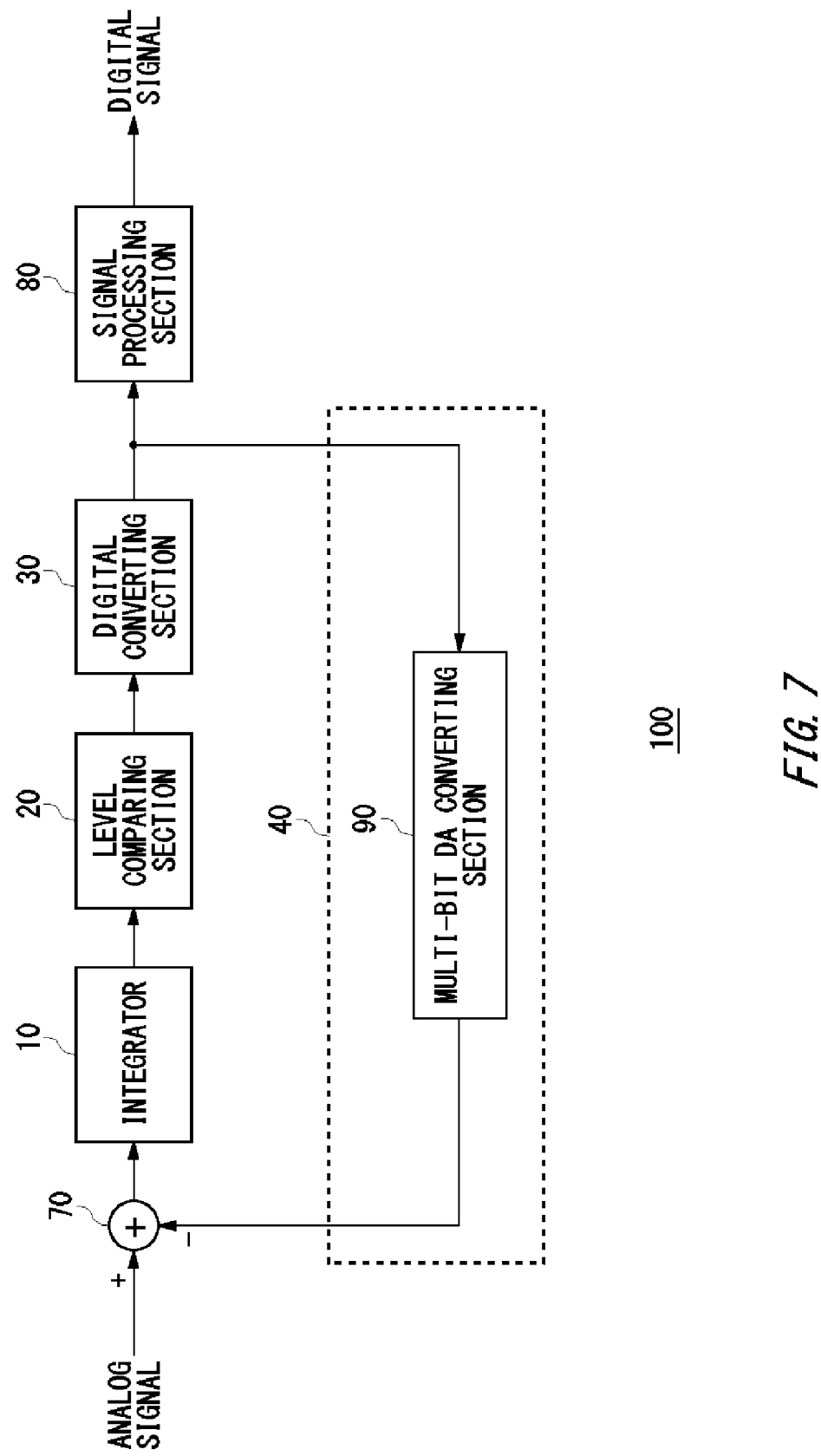
FIG. 7 shows another exemplary configuration of the feedback section 40.

FIG. 7 shows another exemplary configuration of the feedback section 40. The feedback section 40 of the present embodiment subtracts a signal level according to the timing at which the digital converting section 30 detects the excessive state from the signal level of the operational waveform, at a predetermined timing in the operational period, as described in relation to FIG. 1. The feedback section 40 of the present embodiment includes a multi-bit DA converting section 90.

The multi-bit DA converting section 90 generates the feedback signal to have a signal level corresponding to the timing at which the digital converting section 30 detects the excessive state. The multi-bit DA converting section 90 supplies the feedback signal to the level calculating section 70 at a set control timing in the control period.

Figure 8:
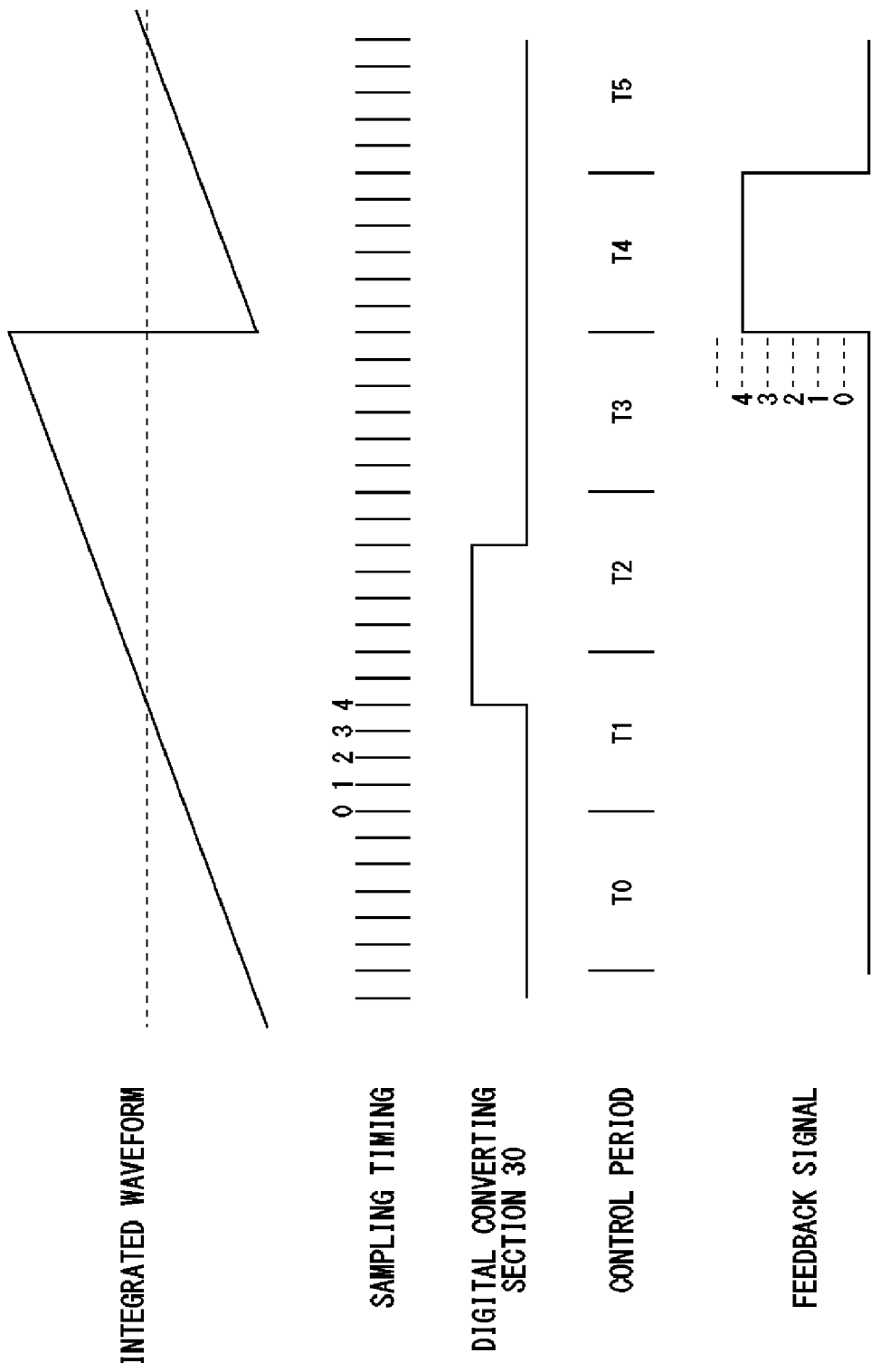
FIG. 8 is a timing chart showing an exemplary operation of the AD converter 100 described in relation to FIG. 2.

FIG. 8 is a timing chart showing an exemplary operation of the AD converter 100 described in relation to FIG. 2. The present embodiment describes an example in which the signal level of the signal under measurement is substantially constant and the slope of the integrated waveform is also substantially constant.

The operation of the digital converting section 30 is the same as that of the digital converting section 30 described in relation to FIG. 3. However, in the example of FIG. 8, the digital converting section 30 detects the timing at which the signal level of the integrated waveform becomes greater than the reference value to be the fourth sampling timing in the cycle T1 of the operational period.

The multi-bit DA converting section 90 generates the feedback signal to have a signal level corresponding to the timing at which the digital converting section 30 detects the excessive state. For example, the multi-bit DA converting section 90 can generate the feedback signal having a different signal level for each sampling timing in the control period.

The multi-bit DA converting section 90 supplies the level calculating section 70 with the feedback signal at a set control timing in the control period. For example, the multi-bit DA converting section 90 may supply the feedback signal to the level calculating section 70 according to a start timing of each cycle of the control period. The multi-bit DA converting section 90 of the present embodiment outputs the feedback signal at the start timing of the cycle T3, which is a prescribed number of cycles after the cycle T1 of the control period in which the digital converting section 30 detects the excessive state.

With this operation, the AD converter 100 can detect the timing of the excessive state with units of temporal resolution that are finer than the operational period of the AD converter 100. Furthermore, since the feedback signal includes information according to this timing, the AD converter 100 can accurately perform the AD conversion.

The AD converter 100 of the present embodiment need not include the timing generating section 50, and in this case the circuit size and the energy consumption are decreased. Since the multi-bit DA converting section 90 can convert the time information detected by the digital converting section 30 into voltage information, the AD converter 100 can accurately generate the digital signal even if requirements for the frequency characteristics of the feedback section 40, the level calculating section 70, and the integrator 10 are loosened.

Figure 9A:
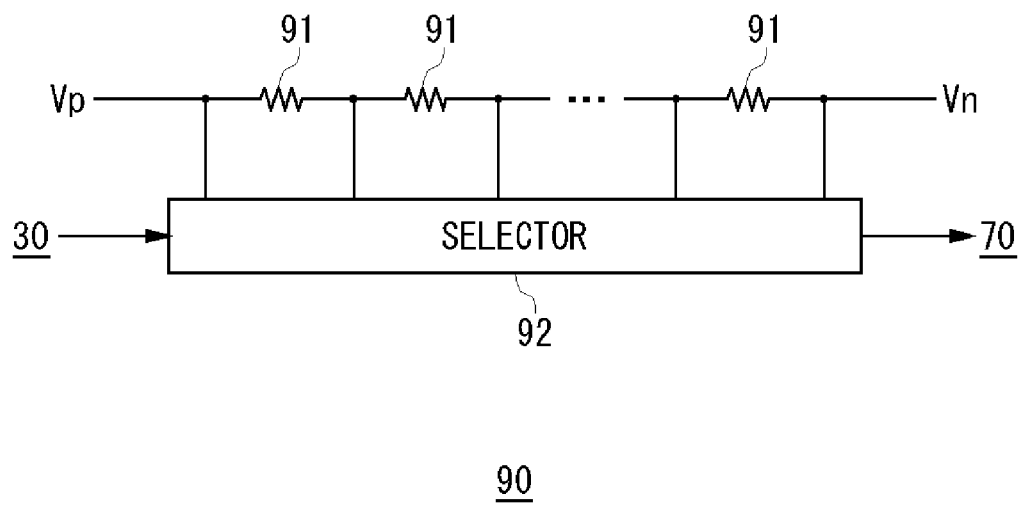
FIG. 9A shows another exemplary configuration of the multi-bit DA converting section 90.

FIG. 9A shows another exemplary configuration of the multi-bit DA converting section 90. The multi-bit DA converting section 90 of the present embodiment includes a plurality of resistors 91 and a selector 92. The plurality of resistors 91 are provided serially between a positive voltage Vp and a negative voltage Vn. Each resistor 91 may have the same resistance value.

The selector 92 receives the voltage at the end of each resistor 91. More specifically, the selector 92 receives a plurality of different voltages resulting from a voltage being sequentially decreased at each resistor 91. The selector 92 then selects a voltage according to the timing information received from the digital converting section 30 and supplies the level calculating section 70 with the feedback signal having the selected voltage.

Figure 9B:
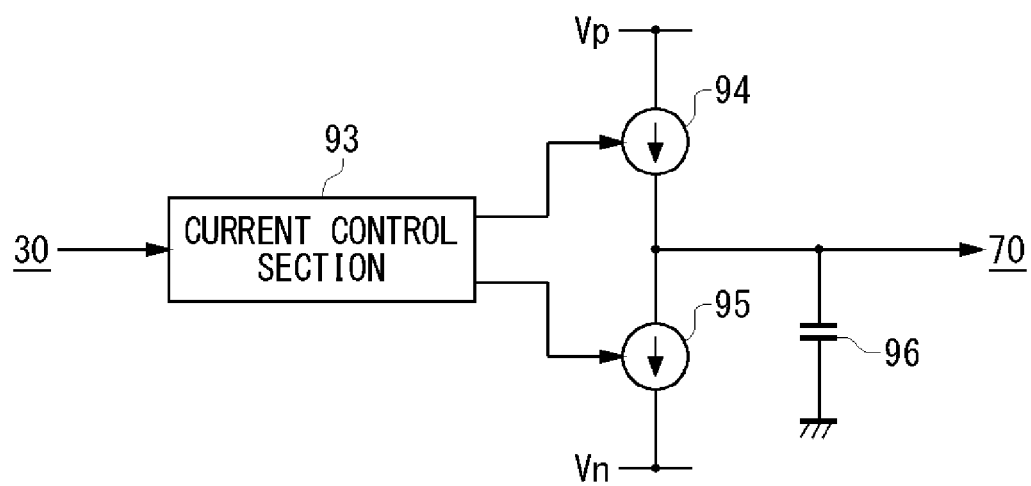
FIG. 9B shows another exemplary configuration of the multi-bit DA converting section 90.
Figure 10:
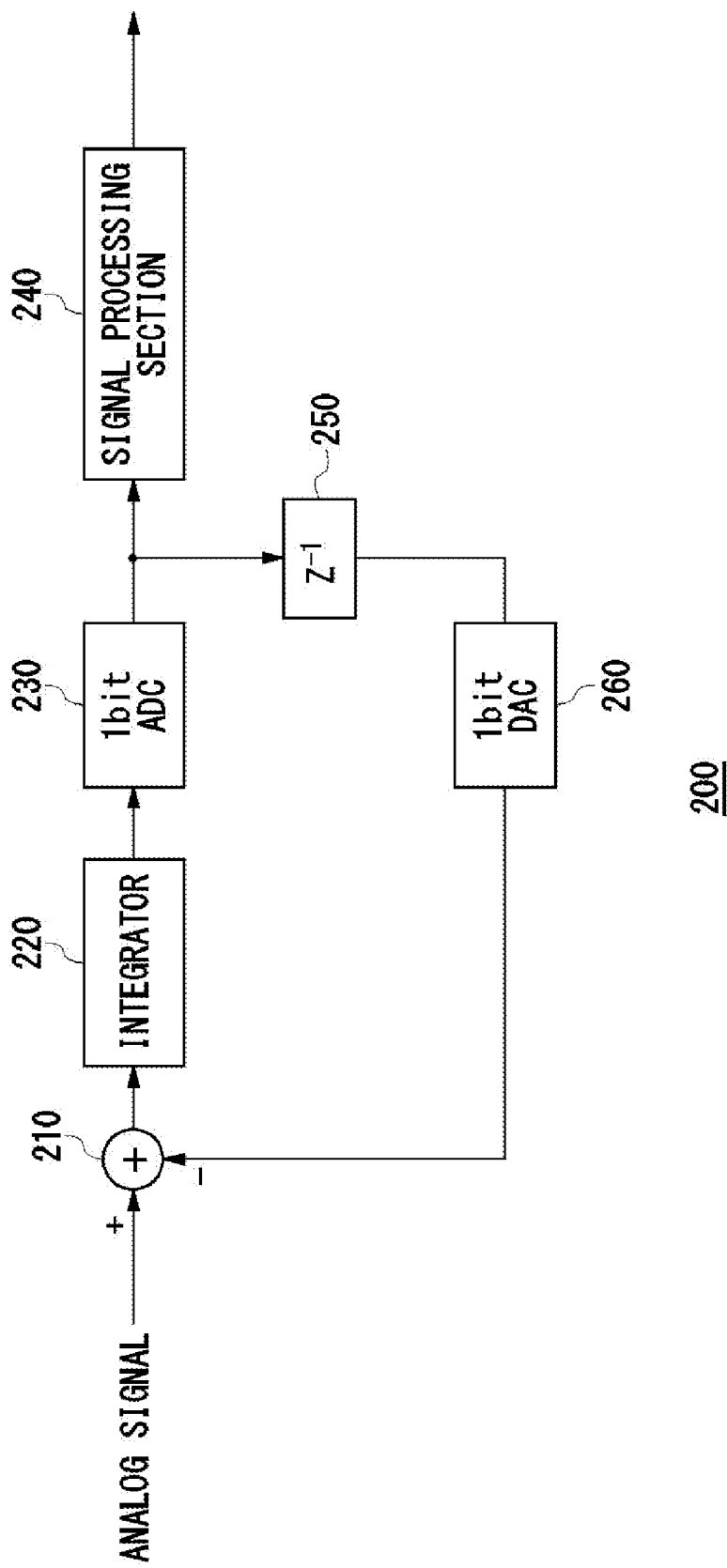
FIG. 10 shows a conventional AD converter 200.

FIG. 9B shows another exemplary configuration of the multi-bit DA converting section 90. The multi-bit DA converting section 90 of the present embodiment includes a current control section 93, a source current supply 94, a sink current supply 95, and a capacitor 96. The source current supply 94 charges the capacitor 96 with a source current having a set current value. The sink current supply 95 discharges the capacitor 96 with a sink current having a set current value. The multi-bit DA converting section 90 supplies the level calculating section 70 with the feedback signal having a signal level corresponding to the voltage of the capacitor 96.

The current control section 93 sets the current values for the source current supply 94 and the sink current supply 95 according to the timing information received from the digital converting section 30. For example, the current control section 93 may set the current values such that charging and discharging the capacitor 96 over one cycle of the operational period results in the voltage of the capacitor 96 having a value according to the timing information.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

By using the embodiments described above, a delta-sigma AD converter can be realized that can more accurately generate a digital signal by enhancing the sampling frequency. For example, when intervals of 10 picoseconds exist between the strobe signals, this AD converter can generate the digital signal with an accuracy equivalent to that of an AD converter with a feedback achieved by detecting the excessive state with 100 giga-samples per second. Furthermore, by using a plurality of sampling results to perform a single feedback, the operational speed of the feedback process can be slowed.

By using a multi-bit DA converting section for the feedback, the circuit size and energy consumption can be decreased. Furthermore, since the multi-bit DA converting section converts time information into voltage information, the AD converter can accurately generate the digital signal even if the requirements for the frequency characteristics of the feedback section and the like are loosened.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An AD converter that converts an input analog signal into a digital signal, comprising:
    an integrator that sequentially integrates signal levels of the analog signal to obtain an integrated waveform, and outputs the integrated waveform;
    a digital converting section that detects, with prescribed units of temporal resolution, a transition timing, which is a timing at which a magnitude relationship between a signal level of the integrated waveform and a prescribed reference value transitions to a predetermined state;
    a feedback section that controls the signal level of the integrated waveform with a control period longer than a unit of temporal resolution, according to a result of the detection by the digital converting section; and
    a signal processing section that generates the digital signal based on the detection result by the digital converting section.

2. The AD converter according to claim 1, wherein
    the feedback section controls the signal level of the integrated waveform with the control period, which is n units of temporal resolution, where n is an integer greater than 1.

3. The AD converter according to claim 2, wherein
    the feedback section adds or subtracts a signal level corresponding to the reference value to or from the signal level of the integrated waveform at a control timing corresponding to the transition timing detected by the digital converting section in the control period.

4. The AD converter according to claim 3, wherein
    the feedback section detects the control timing in the control period with units of temporal resolution that are substantially equal to the units of temporal resolution of the digital converting section.

5. The AD converter according to claim 4, wherein
    the digital converting section sequentially detects whether the magnitude relationship between the signal level of the integrated waveform and the prescribed reference value has transitioned to a prescribed state, at sampling timings with periods shorter than the control period, and
    the feedback section controls the signal level of the integrated waveform after a plurality of sampling timings have passed since a sampling timing at which the digital converting section detects the transition timing.

6. The AD converter according to claim 5, wherein
    the feedback section controls the signal level of the integrated waveform according to a duration over which the magnitude relationship continues to be in the prescribed state.

7. The AD converter according to claim 5, wherein the digital converting section includes:
    a plurality of delay elements connected in cascade that generate a plurality of strobe signals by sequentially delaying a reference clock having a period that is the same as the control period; and
    a detection circuit that, in each cycle of the reference clock, detects the magnitude relationship between the signal level of the integrated waveform and the reference value at sampling timings according to the strobe signals output by the delay elements.

8. The AD converter according to claim 7, wherein
    when the detection circuit detects the transition timing in a cycle of the reference clock, the feedback section adds or subtracts a predetermined signal level to or from the signal level of the integrated waveform in a cycle that is after the cycle of the reference clock in which the transition timing is detected.

9. The AD converter according to claim 8, wherein
    upon detecting the transition timing in a cycle of the reference clock, the detection circuit generates timing information that indicates a timing, in the cycle, of the strobe signal that detected the transition timing, and
    the feedback section includes:
    a timing generating section that generates a feedback signal by delaying, according to the timing information, a pulse of the reference clock in a cycle following the cycle in which the transition timing is detected; and
    a level calculating section that adds or subtracts a predetermined signal level to or from the signal level of the integrated waveform according to the feedback signal.

10. The AD converter according to claim 7, further comprising a setting section that sets a delay time for each of the delay elements.

11. The AD converter according to claim 7, further comprising a level comparing section that outputs a logic value according to a comparison result between the signal level of the integrated waveform and the reference value, wherein
    the detection circuit detects the logic value output by the level comparing section, at each of the sampling timings.

12. The AD converter according to claim 2, wherein
    the feedback section adds or subtracts a signal level corresponding to the transition timing detected by the digital converting section to or from the signal level of the integrated waveform.

13. The AD converter according to claim 12, wherein
    the feedback section controls the signal level of the integrated waveform at a set control timing in the control period.

14. The AD converter according to claim 1, wherein
    the digital converting section sequentially detects whether the magnitude relationship between the signal level of the integrated waveform and the prescribed reference value has transitioned to a prescribed state, at sampling timings having periods less than the control period.

15. The AD converter according to claim 1, wherein
the integrator sequentially integrates a signal level of a first analog signal to obtain an integrated waveform, and outputs the resulting integrated waveform, and
the digital converting section acquires, as the prescribed reference value, a signal level of a waveform obtained by sequentially integrating a signal level of a second analog signal.

* * * * *